United States Patent
Mitsugi (10) Patent No.: US 12,087,106 B2
(45) Date of Patent: Sep. 10, 2024

(54) BATTERY ABNORMALITY WARNING METHOD AND BATTERY ABNORMALITY WARNING DEVICE

(71) Applicant: Nissan Motor Co., Ltd., Yokohama (JP)

(72) Inventor: Hiroaki Mitsugi, Kanagawa (JP)

(73) Assignee: Nissan Motor Co., Ltd., Yokohama (JP)

(*) Notice: Subject to any disclaimer, the term of this patent is extended or adjusted under 35 U.S.C. 154(b) by 237 days.

(21) Appl. No.: 17/913,178

(22) PCT Filed: Apr. 6, 2020

(86) PCT No.: PCT/JP2020/015482
§ 371 (c)(1),
(2) Date: Sep. 21, 2022

(87) PCT Pub. No.: WO2021/205502
PCT Pub. Date: Oct. 14, 2021

(65) Prior Publication Data
US 2023/0134666 A1 May 4, 2023

(51) Int. Cl.
*G01R 31/392* (2019.01)
*G01R 31/3835* (2019.01)
(Continued)

(52) U.S. Cl.
CPC ....... *G07C 5/0816* (2013.01); *G01R 31/3835* (2019.01); *G01R 31/392* (2019.01);
(Continued)

(58) Field of Classification Search
CPC .............. G07C 5/0816; G01R 31/3835; G01R 31/392; G01R 31/396; H01M 10/488;
(Continued)

(56) References Cited

U.S. PATENT DOCUMENTS

| | | | |
|---|---|---|---|
| 2003/0133240 A1* | 7/2003 | Manabe | H02J 7/1438 361/90 |
| 2019/0120912 A1* | 4/2019 | Chen | H02J 7/0029 |
| 2020/0130509 A1* | 4/2020 | Takao | H01M 10/425 |

FOREIGN PATENT DOCUMENTS

| CN | 103221835 A | * | 7/2013 | ............. G01R 31/36 |
|---|---|---|---|---|
| CN | 104950163 A | * | 9/2015 | |

(Continued)

OTHER PUBLICATIONS

CN212062618U.translate, Li et al.; Modern Auto Yancheng Co Ltd; Wireless communication battery management system, power battery system and automobile. (Year: 2020).*

(Continued)

*Primary Examiner* — B M M Hannan
(74) *Attorney, Agent, or Firm* — Global IP Counselors, LLP (57) ABSTRACT

A battery abnormality warning method involves detecting an abnormality in a vehicle-mounted battery and warning an occupant in the vehicle. The battery abnormality warning method determines whether a pressure abnormality has occurred in the battery based on an air pressure inside a battery pack of the battery. The battery abnormality warning method further determines whether a voltage abnormality has occurred in the battery based on a cell voltage of the battery. An abnormality is determined to have occurred in the battery when both a pressure abnormality in the battery and a voltage abnormality in the battery are determined to have occurred within a prescribed time period. A warning is outputted to the occupant in the vehicle upon determining that an abnormality has occurred in the battery.

5 Claims, 5 Drawing Sheets

(51) Int. Cl.
*G01R 31/396* (2019.01)
*G07C 5/08* (2006.01)
*H01M 10/48* (2006.01)

(52) U.S. Cl.
CPC ........ *G01R 31/396* (2019.01); *H01M 10/488* (2013.01); *H01M 2220/20* (2013.01)

(58) Field of Classification Search
CPC ............. H01M 2220/20; H01M 10/42; H01M 10/425; H01M 10/48; H01M 10/482; H01M 2010/4271; H02J 2310/40; H02J 7/0029; H02J 7/00308; H02J 7/0047; Y02E 60/10
USPC ........................................................ 701/34.4
See application file for complete search history.

(56) References Cited

FOREIGN PATENT DOCUMENTS

| | | | | | |
|---|---|---|---|---|---|
| CN | 105609833 | A | * | 5/2016 | ........ H01M 8/04089 |
| CN | 105620304 | A | * | 6/2016 | |
| CN | 205292321 | U | * | 6/2016 | |
| CN | 107123768 | A | * | 9/2017 | ............ B60L 3/0046 |
| CN | 107123769 | A | * | 9/2017 | .............. B60L 50/64 |
| CN | 107134821 | A | * | 9/2017 | ............ H02J 7/0036 |
| CN | 207842672 | U | | 9/2018 | |
| CN | 112119318 | A | * | 12/2020 | ........... G01R 31/388 |
| CN | 212062618 | U | * | 12/2020 | |
| JP | H8-78000 | A | | 3/1996 | |
| JP | 8-140280 | A | | 5/1996 | |
| JP | 2000177570 | A | * | 6/2000 | ............ B60T 17/221 |
| JP | 2003-197268 | A | | 7/2003 | |
| JP | 2004147422 | A | * | 5/2004 | |
| JP | 2008064549 | A | * | 3/2008 | |
| JP | 2009-10443 | A | | 1/2009 | |
| JP | 2011069686 | A | * | 4/2011 | |
| JP | 4747525 | B2 | * | 8/2011 | |
| JP | 2019-198195 | A | | 11/2019 | |
| JP | 2020108206 | A | * | 7/2020 | |
| JP | 2021012793 | A | * | 2/2021 | |
| JP | 2021072755 | A | * | 5/2021 | ............ G01R 31/367 |

OTHER PUBLICATIONS

JP2009110850.translate; Taniguchi et al.; Nissan Motor; Fuel Cell System and Control Method of Fuel Cell System. (Year: 2009).*

* cited by examiner

BATTERY ABNORMALITY WARNING METHOD AND BATTERY ABNORMALITY WARNING DEVICE

CROSS-REFERENCE TO RELATED APPLICATIONS

This application is a U.S. national stage application of International Application No. PCT/JP2020/015482, filed on Apr. 6, 2020.

BACKGROUND

Technical Field

The present invention relates to a battery abnormality warning method and a battery abnormality warning device in which an abnormality in a vehicle-mounted battery is detected and an occupant in the vehicle is warned.

Background Information

In the prior art, Japanese Laid-Open Patent Application No. 8-78000 (Patent Document 1) discloses a protective device for stopping usage of a storage battery in which an abnormality involving an increase in internal air pressure has occurred. In the protective device disclosed in Patent Document 1, a housing body and a lid body are joined so as to hermetically seal the interior of the housing body, and a configuration is adopted in which, when the pressure inside the storage battery increases, continuity between the housing body and the lid body is disrupted due to flexing of the lid body.

SUMMARY

However, when an abnormality is assessed on the basis of only a pressure inside a storage battery, as with the prior-art protective device described above, it is impossible to distinguish between abnormalities that have a low degree of importance, or that arise from temporary factors, and abnormalities that have a high degree of importance, therefore causing a problem in that abnormalities that have a high degree of importance cannot be reliably detected. For example, in a vehicle-mounted battery, an air pressure in the interior of the battery changes depending on an altitude of a location through which the vehicle is travelling and a strength of cooling air from a battery cooler. Therefore, when an abnormality in the battery is assessed on the basis of only the air pressure in the interior of the battery, it is impossible to distinguish whether the air pressure is increasing due to an abnormality that has a low degree of importance, or that arises from a temporary factor, or due to an abnormality that has a high degree of importance. As a result, there have been cases where it was impossible to accurately detect an abnormality that had a high degree of importance, such as thermal runaway.

The present invention was proposed in view of the circumstances described above, it being an object of the invention to provide a battery abnormality warning method and a battery abnormality warning device with which it is possible to distinguish between abnormalities that have a low degree of importance, or that arise from temporary factors, and abnormalities that have a high degree of importance, and to accurately detect abnormalities that have a high degree of importance.

In order to solve the problems described above, in a battery abnormality warning method and a device therefor according to one aspect of the present invention, a determination as to whether a pressure abnormality has occurred in a battery is made on the basis of an air pressure inside a battery pack, and a determination as to whether a voltage abnormality has occurred in the battery is made on the basis of a cell voltage of the battery. An abnormality is determined to have occurred in the battery when both a pressure abnormality in the battery and a voltage abnormality in the battery are determined to have occurred within a prescribed time period, and a warning is outputted to an occupant in a vehicle when it is determined that an abnormality has occurred in the battery.

According to the present invention, it is possible to distinguish between abnormalities that have a low degree of importance, or that arise from temporary factors, and abnormalities that have a high degree of importance, and to accurately detect abnormalities that have a high degree of importance.

BRIEF DESCRIPTION OF THE DRAWINGS

Referring now to the attached drawings which form a part of this original disclosure.

DETAILED DESCRIPTION OF EMBODIMENTS

A preferred embodiment in which the present invention is applied is described below with reference to the accompanying drawings. In descriptions pertaining to the drawings, identical reference symbols are associated with identical portions, and redundant description of such portions is omitted.

Configuration of Battery Abnormality Warning System

Figure 1:
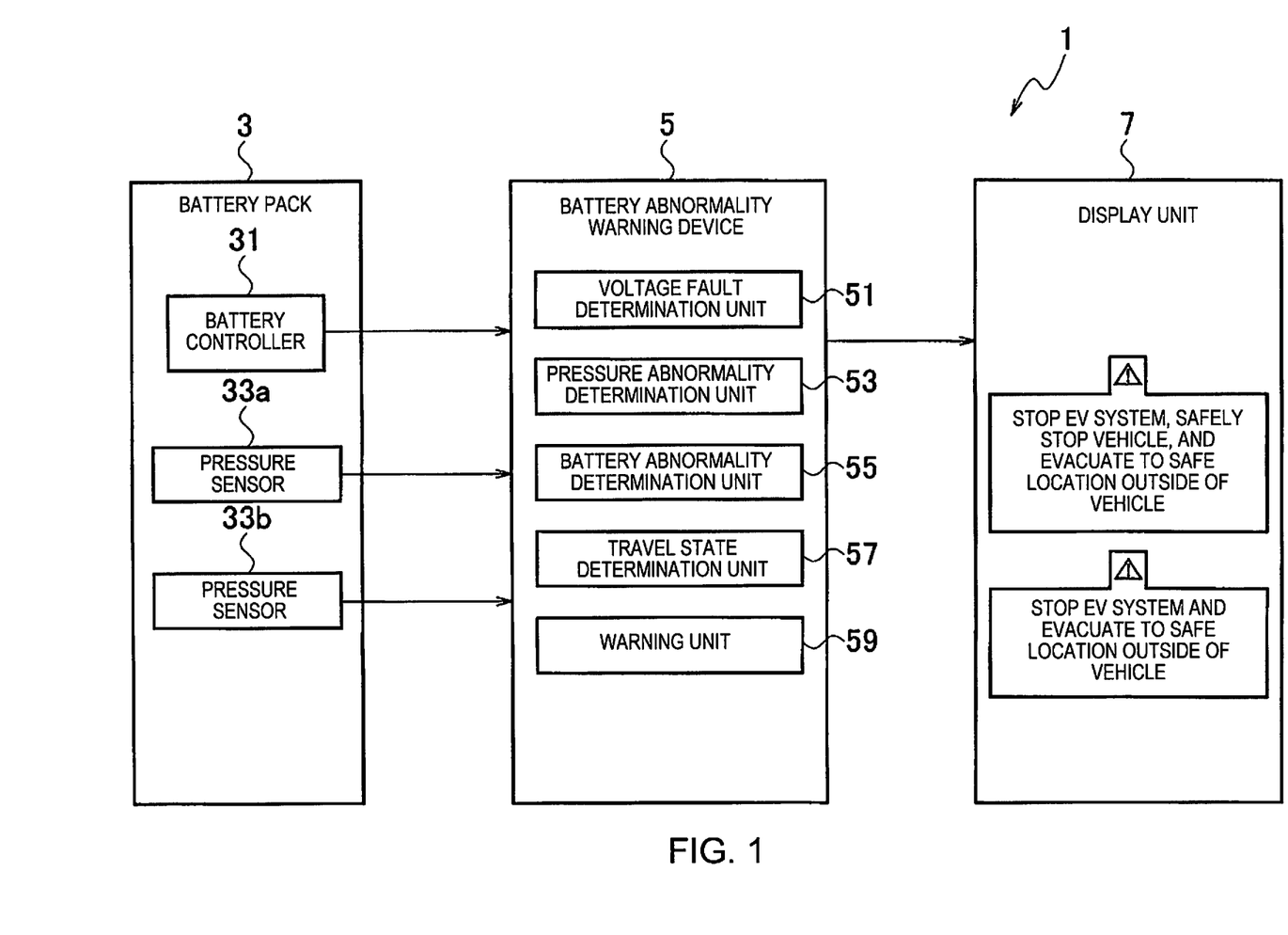
FIG. 1 is a block diagram showing a configuration of a battery abnormality warning system according to one embodiment of the present invention.

FIG. 1 is a block diagram showing a configuration of a battery abnormality warning system according to one embodiment of the present invention. As shown in FIG. 1, the battery abnormality warning system 1 according to the present embodiment is provided with a vehicle-mounted battery pack 3, a battery abnormality warning device 5 implemented in a vehicle control module, and a display unit 7 provided to a meter panel of the vehicle.

The battery abnormality warning system 1 is mounted in the vehicle and is configured to detect an abnormality that has occurred in the battery pack 3 and warn an occupant in the vehicle. Using the battery abnormality warning system 1 makes it possible to distinguish between abnormalities that have a low degree of importance, or that arise from temporary factors, and abnormalities that have a high degree of importance, among abnormalities that have occurred in the battery pack 3, and to detect abnormalities that have a high degree of importance. In particular, the battery abnormality warning system 1 has functions for detecting thermal runaway as an abnormality that has a high degree of importance and warning the occupant before a thermal chain reaction occurs. Thermal runaway is an abnormality in which a cell constituting a lithium-ion battery in the battery pack 3 short-circuits, whereby heat is produced and associated damage occurs. A thermal chain reaction is an abnormality in which heat from a cell that has undergone thermal runaway propagates to surrounding cells and a chain reaction ensues. In the present embodiment, thermal runaway is described as one example of an abnormality that has a high degree of importance, but abnormalities other than thermal runaway can also be employed.

The battery pack 3 is mounted in the vehicle and is configured as a high-voltage battery pack provided with a lithium-ion battery. The battery pack 3 is provided with a battery controller 31 and pressure sensors 33a, 33b, and additionally is provided with a battery cooler and a junction box. Although the battery pack 3 is hermetically sealed, air pressure in the interior thereof is gently controlled due to the battery pack 3 being provided with a breather (vent port).

The battery controller 31 monitors the state of the lithium-ion battery, detecting and monitoring the state of charge, input/output voltage, temperature, etc., of the lithium-ion battery. In particular, the battery controller 31 detects the minimum voltage, average voltage, maximum voltage, etc., of the cells constituting the lithium-ion battery and outputs detected values to the vehicle control module through communication via a controller area network (CAN communication).

The pressure sensors 33a, 33b detect the air pressure inside the battery pack 3 and output detected values to the vehicle control module through CAN communication or through use of a wire harness. Two pressure sensors are installed, and the air pressure inside the battery pack 3 can be continuously detected even if one of the pressure sensors fails. The vehicle control module compares the values detected by the two pressure sensors, thereby diagnosing failure of the pressure sensors.

The battery abnormality warning device 5 is implemented in the vehicle control module, and is configured to detect an abnormality in the battery pack 3 and warn the occupant in the vehicle. As shown in FIG. 1, the battery abnormality warning device 5 is provided with a voltage abnormality determination unit 51, a pressure abnormality determination unit 53, a battery abnormality determination unit 55, a travel state determination unit 57, and a warning unit 59. The battery abnormality warning device 5 acquires information indicating the state of the lithium-ion battery from the battery controller 31, and in particular acquires the minimum voltage of the cells constituting the lithium-ion battery through CAN communication. Additionally, the battery abnormality warning device 5 acquires the air pressure inside the battery pack 3 from the pressure sensors 33a, 33b through CAN communication or through use of a wire harness. When it is determined that an abnormality has occurred in the battery pack 3, the battery abnormality warning device 5 outputs a warning to the occupant in the vehicle. When outputting the warning, the battery abnormality warning device 5 causes a warning message to be displayed on the display unit 7 and outputs a sound such as a warning noise or warning message from a speaker installed inside the vehicle.

The voltage abnormality determination unit 51 acquires the minimum voltage of the cells constituting the lithium-ion battery from the battery controller 31 and determines, on the basis of the cell voltage in the lithium-ion battery, whether a voltage abnormality has occurred in the battery pack 3. Specifically, the voltage abnormality determination unit 51 determines that a voltage abnormality has occurred in the battery pack 3 when the minimum voltage of the cells is equal to or less than a prescribed voltage determination threshold value. The voltage determination threshold value is set by verifying, through experimentation or simulation, a voltage at which it is considered that an abnormality occurs in the lithium-ion battery.

Because the lithium-ion battery short-circuits when thermal runaway occurs in the battery pack 3, the cell voltage does not increase again after having decreased. Therefore, once a voltage abnormality has been determined, that determination continues. However, in a case in which an abnormality other than thermal runaway occurs, the cell temperature might increase again even after having decreased, and the determination of a voltage abnormality is cancelled if the cell temperature increases again. When the determination of a voltage abnormality is to be cancelled, said determination is cancelled only if the cell voltage exceeds a value higher than the voltage determination threshold value by a given value, rather than simply exceeding the voltage determination threshold value. In a case in which there is an abnormality in the CAN communication and data cannot be normally acquired, the voltage abnormality determination unit 51 determines, as a precaution, that a voltage abnormality has occurred.

The pressure abnormality determination unit 53 acquires the air pressure inside the battery pack 3 from the pressure sensors 33a, 33b and determines, on the basis of the air pressure inside the battery pack 3, whether a pressure abnormality has occurred in the battery pack 3. Specifically, the pressure abnormality determination unit 53 determines that a pressure abnormality has occurred in the battery pack 3 when a prescribed decision time period has elapsed while an amount of change in the air pressure inside the battery pack 3 is equal to or greater than a prescribed pressure determination threshold value.

The pressure abnormality determination unit 53 determines a pressure abnormality by using the amount of change in the air pressure rather than using an absolute value of the air pressure inside the battery pack 3. Because the air pressure inside the battery pack 3 decreases when the vehicle travels through a high-altitude location, an erroneous determination might be made if a pressure abnormality is determined using the absolute value of the air pressure. Thus, the pressure abnormality determination unit 53 calculates the amount of change from a value of the air pressure a given time period earlier and determines a pressure abnormality by using the amount of change in the air pressure. This makes it possible to accurately determine a pressure abnormality even if the air pressure inside the battery pack 3 changes due to a change in the altitude of a location through which the vehicle is traveling.

Furthermore, the pressure abnormality determination unit 53 determines that a pressure abnormality has occurred in the battery pack 3 when the prescribed decision time period has elapsed while the amount of change in the air pressure is equal to or greater than the pressure determination threshold value. The decision time period is set to a time period for which it is considered that an increase in the air pressure will continue when a pressure abnormality has occurred. Even if a pressure abnormality occurs in the battery pack 3 and the air pressure increases, the air pressure will gradually decrease because the battery pack 3 is provided with the breather. Thus, the decision time period is set by verifying, through experimentation or simulation, a time period for which the amount of change in the air pressure continues to be equal to or greater than the pressure determination threshold value when a pressure abnormality has occurred. The pressure determination threshold value is also set by verifying, through experimentation or simulation, an amount of change in the air pressure when a pressure abnormality has occurred.

When a pressure abnormality is thus determined, the pressure abnormality determination unit 53 continues determination of a pressure abnormality until a prescribed time period elapses from when a pressure abnormality is determined to have occurred in the battery pack 3, and cancels determination of a pressure abnormality when the prescribed time period elapses. The pressure abnormality determination unit 53 sets a continuation time period during which the determination of a pressure abnormality is continued, and, during the continuation time period, continues the determination of a pressure abnormality even if the air pressure inside the battery pack 3 decreases. The determination of a pressure abnormality is cancelled when the continuation time period elapses.

When thermal runaway has occurred among abnormalities that have occurred in the battery pack 3, a voltage abnormality occurs in addition to a pressure abnormality. Thus, the continuation time period is set by verifying, through experimentation or simulation, the extent of a time period within which a voltage abnormality occurs from the occurrence of a pressure abnormality in a case in which thermal runaway has occurred. When a voltage abnormality is determined to have occurred during the continuation time period, a determination that thermal runaway has occurred in the battery pack 3 is made by the battery abnormality determination unit 55.

The battery abnormality determination unit 55 determines that an abnormality has occurred in the battery pack 3 when both a pressure abnormality in the battery pack 3 and a voltage abnormality in the battery pack 3 are determined to have occurred within a prescribed time period. Specifically, when it is determined that a pressure abnormality has occurred in the battery pack 3 and that a voltage abnormality has occurred within the continuation time period, the battery abnormality determination unit 55 determines that an abnormality has occurred in the battery pack 3. The battery abnormality determination unit 55 also determines that an abnormality has occurred in the battery pack 3 in a case in which it is determined that a pressure abnormality has occurred when it is determined that a voltage abnormality has occurred in the battery pack 3.

The travel state determination unit 57 determines a travel state of the vehicle on the basis of information from the vehicle control module, etc. Specifically, the travel state determination unit 57 assesses whether the vehicle is traveling or is stopped, and outputs a result of the assessment to the warning unit 59.

The warning unit 59 outputs a warning to the occupant in the vehicle when it is determined by the battery abnormality determination unit 55 that an abnormality has occurred in the battery pack 3. Specifically, the warning unit 59 outputs a warning message to the display unit 7 and causes the display unit 7 to display the warning message, and also outputs the sound such as a warning noise or warning message to a speaker installed inside the vehicle. When outputting the warning, the warning unit 59 changes the warning message in accordance with the travel state of the vehicle as acquired from the travel state determination unit 57. For example, as shown in FIG. 1, the warning unit 59 outputs a warning message prompting the occupant to "safely stop the vehicle and evacuate to a safe location outside of the vehicle" while the vehicle is traveling, and outputs a warning message prompting the occupant to "evacuate to a safe location outside of the vehicle" while the vehicle is stopped.

The display unit 7 is a display provided to a meter panel, the display unit 7 displaying the warning message as shown in FIG. 1. Additionally, a warning lamp can be provided in advance to the meter panel, and the warning lamp can be illuminated. The sound such as a warning noise or warning message is outputted from the speaker at the same time as when the warning message is displayed.

The battery abnormality warning device 5 is provided with a controller, the controller being configured from a general-purpose electronic circuit, including a microcomputer, microprocessor, or central processing unit (CPU), as well as from peripherals such as a memory. The controller has functions for detecting an abnormality in the battery pack 3 and outputting a warning. The functions of the controller can be implemented using one or a plurality of processing circuits. The one or plurality of processing circuits include, e.g., an electric-circuit-including processing device or another programmed processing device, and also include an application-specific integrated circuit (ASIC) or conventional circuit component arranged so as to execute the functions described in the embodiment.

Battery Abnormality Warning Method

Figure 2:
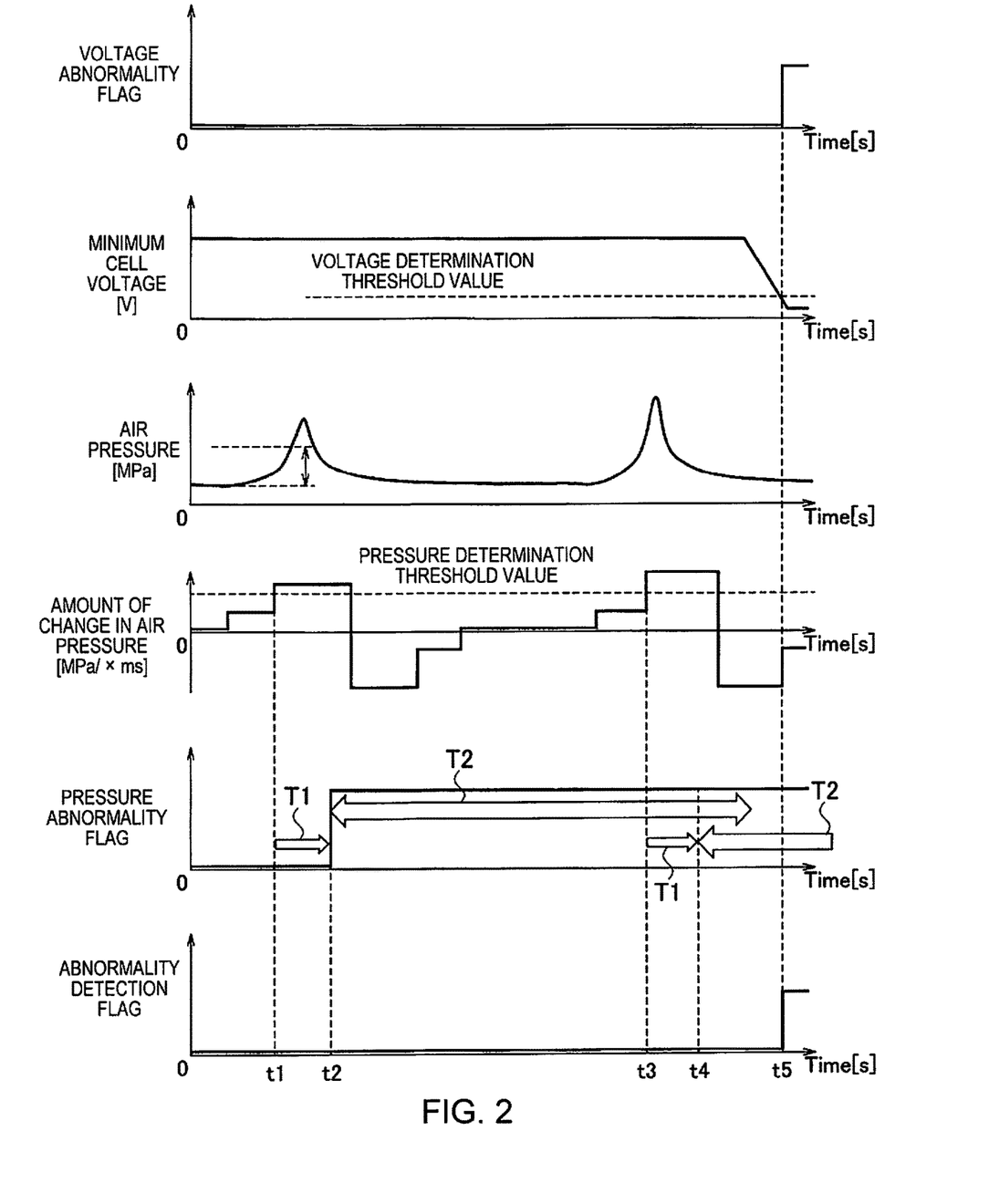
FIG. 2 is a timing chart for illustrating a battery abnormality warning method performed by a battery abnormality warning device according to the one embodiment of the present invention.

A battery abnormality warning method performed using the battery abnormality warning device 5 according to the present embodiment is described next. FIG. 2 is a timing chart for illustrating the battery abnormality warning method performed by the battery abnormality warning device 5 according to the present embodiment.

As shown in FIG. 2, at time t1, the air pressure inside the battery pack 3 increases, and the amount of change in the air pressure reaches or exceeds the pressure determination threshold value. When the decision time period T1 elapses and time t2 is reached while the amount of change in the air pressure is equal to or greater than the pressure determination threshold value, the pressure abnormality determination unit 53 determines that a pressure abnormality has occurred in the battery pack 3 and sets a pressure abnormality flag.

At time t2, if the pressure abnormality flag is set, the pressure abnormality determination unit 53 starts a count of a continuation time period T2, and, during the continuation time period T2, continues the determination of a pressure abnormality even if the air pressure inside the battery pack 3 decreases. However, because no voltage abnormality is determined during the continuation time period T2, the pressure abnormality at time t1 is considered to be an abnormality other than thermal runaway, such as an abnormality in refrigerant of the battery cooler.

Time t3 is then reached without a voltage abnormality having been determined, the air pressure inside the battery pack 3 increases again, and the amount of change in the air pressure reaches or exceeds the pressure determination threshold value. When the decision time period T1 elapses and time t4 is reached while the amount of change in the air pressure is equal to or greater than the pressure determination threshold value, the pressure abnormality determination unit 53 again determines that a pressure abnormality has occurred in the battery pack 3, and again sets and starts a continuation time period T2 from the time t4 at which a pressure abnormality is again determined.

At time t5, the minimum cell voltage then reaches or falls below the voltage determination threshold value, and the voltage abnormality determination unit 51 determines that a voltage abnormality has occurred in the battery pack 3 and sets a voltage abnormality flag. At the same time, because both a pressure abnormality and a voltage abnormality are determined to have occurred within the continuation time period T2, the battery abnormality determination unit 55 determines that a thermal runaway abnormality has occurred in the battery pack 3 and sets an abnormality detection flag. The warning unit 59 then outputs a warning.

Thus, the battery abnormality warning device 5 determines that an abnormality has occurred in the battery pack 3 when both a pressure abnormality and a voltage abnormality are determined to have occurred within a prescribed time period; therefore, it is possible to reliably detect the occurrence of an abnormality that has a high degree of importance, such as thermal runaway. For example, if an abnormality in the battery is determined while only a pressure abnormality has occurred, as with the pressure abnormality at time t1 in FIG. 2, there is a possibility that what is detected is an abnormality having a low degree of importance, such as an abnormality in the refrigerant of the battery cooler. However, determining an abnormality in the battery by using both a pressure abnormality and a voltage abnormality makes it possible to reliably detect an abnormality that has a high degree of importance, such as thermal runaway.

Additionally, when the battery abnormality warning device 5 again determines the occurrence of a pressure abnormality, the battery abnormality warning device 5 again sets and starts the continuation time period T2 from a point when a pressure abnormality is detected again. This makes it possible to reliably detect an abnormality that has a high degree of importance even when a plurality of abnormalities have occurred at the same time. For example, when a pressure abnormality other than thermal runaway has occurred, as with the pressure abnormality at time t1 in FIG. 2, thermal runaway cannot be detected because the continuation time period T2 that started at time t2 is already ended at the time t5 at which a voltage abnormality is determined. However, because the battery abnormality warning device 5 again sets and starts the continuation time period T2 at time t4, it is possible to detect an abnormality that has a high degree of importance, such as thermal runaway, due to the determination of a voltage abnormality at time t5.

Figure 3:
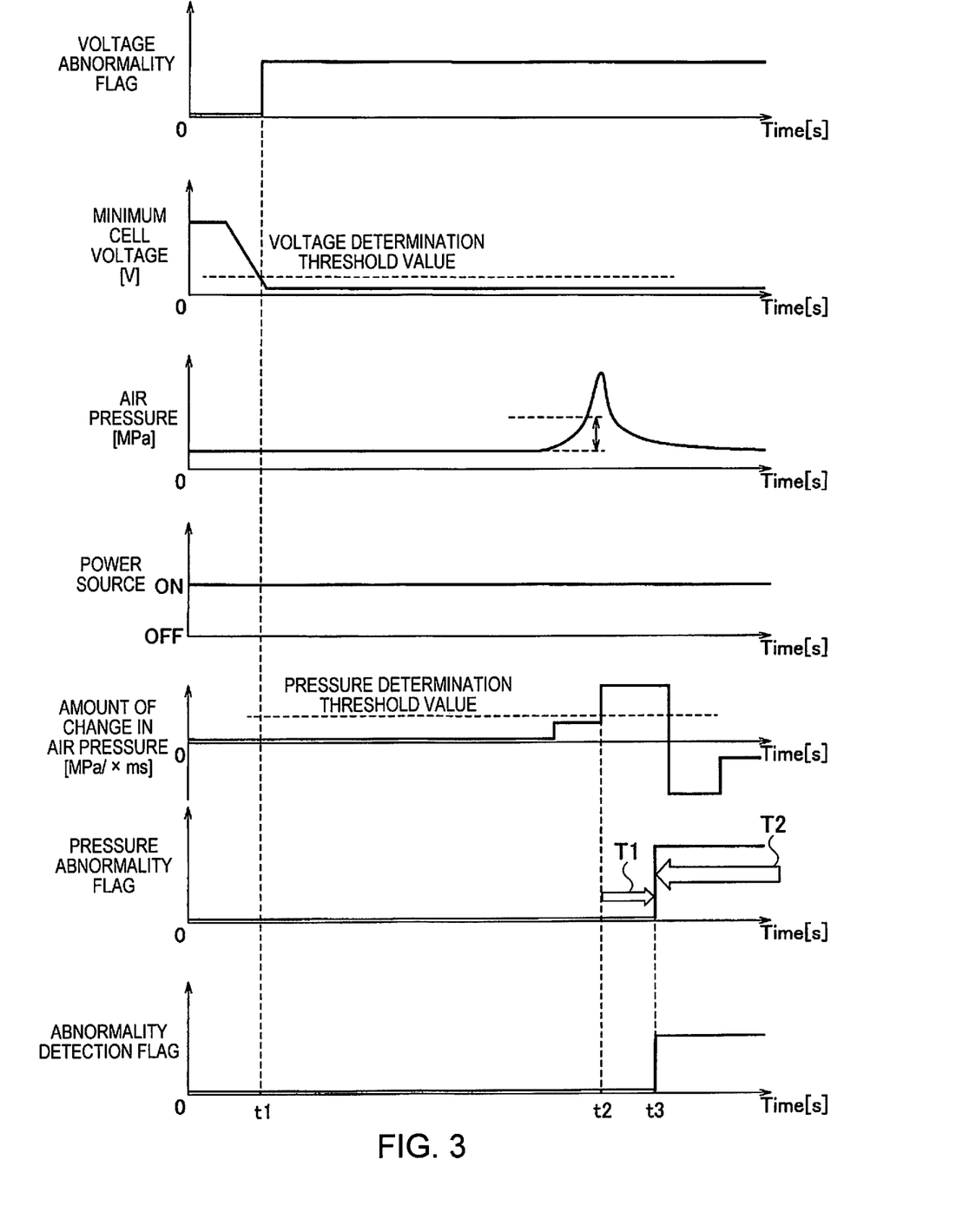
FIG. 3 is a timing chart for illustrating the battery abnormality warning method performed by the battery abnormality warning device according to the one embodiment of the present invention.

A battery abnormality warning method for a case in which a voltage abnormality occurs before a pressure abnormality occurs is described next on the basis of the timing chart in FIG. 3. As shown in FIG. 3, at time t1, the minimum cell voltage reaches or falls below the voltage determination threshold value, and the voltage abnormality determination unit 51 determines that a voltage abnormality has occurred in the battery pack 3 and sets the voltage abnormality flag. Because the cell voltage does not increase again when thermal runaway has occurred in the battery pack 3, the determination of a voltage abnormality is then continued.

At time t2, the air pressure inside the battery pack 3 increases, and the amount of change in the air pressure reaches or exceeds the pressure determination threshold value. When the decision time period T1 elapses and time t3 is reached while the amount of change in the air pressure is equal to or greater than the pressure determination threshold value, the pressure abnormality determination unit 53 determines that a pressure abnormality has occurred in the battery pack 3 and sets the pressure abnormality flag. At the same time, because both a pressure abnormality and a voltage abnormality are determined to have occurred, the battery abnormality determination unit 55 determines that a thermal runaway abnormality has occurred in the battery pack 3 and sets an abnormality detection flag. The warning unit 59 then outputs a warning.

Because the battery abnormality warning device 5 thus determines that an abnormality has occurred in the battery pack 3 when both a pressure abnormality and a voltage abnormality are determined to have occurred, it is possible to reliably detect an abnormality that has a high degree of importance, such as thermal runaway.

Figure 4:
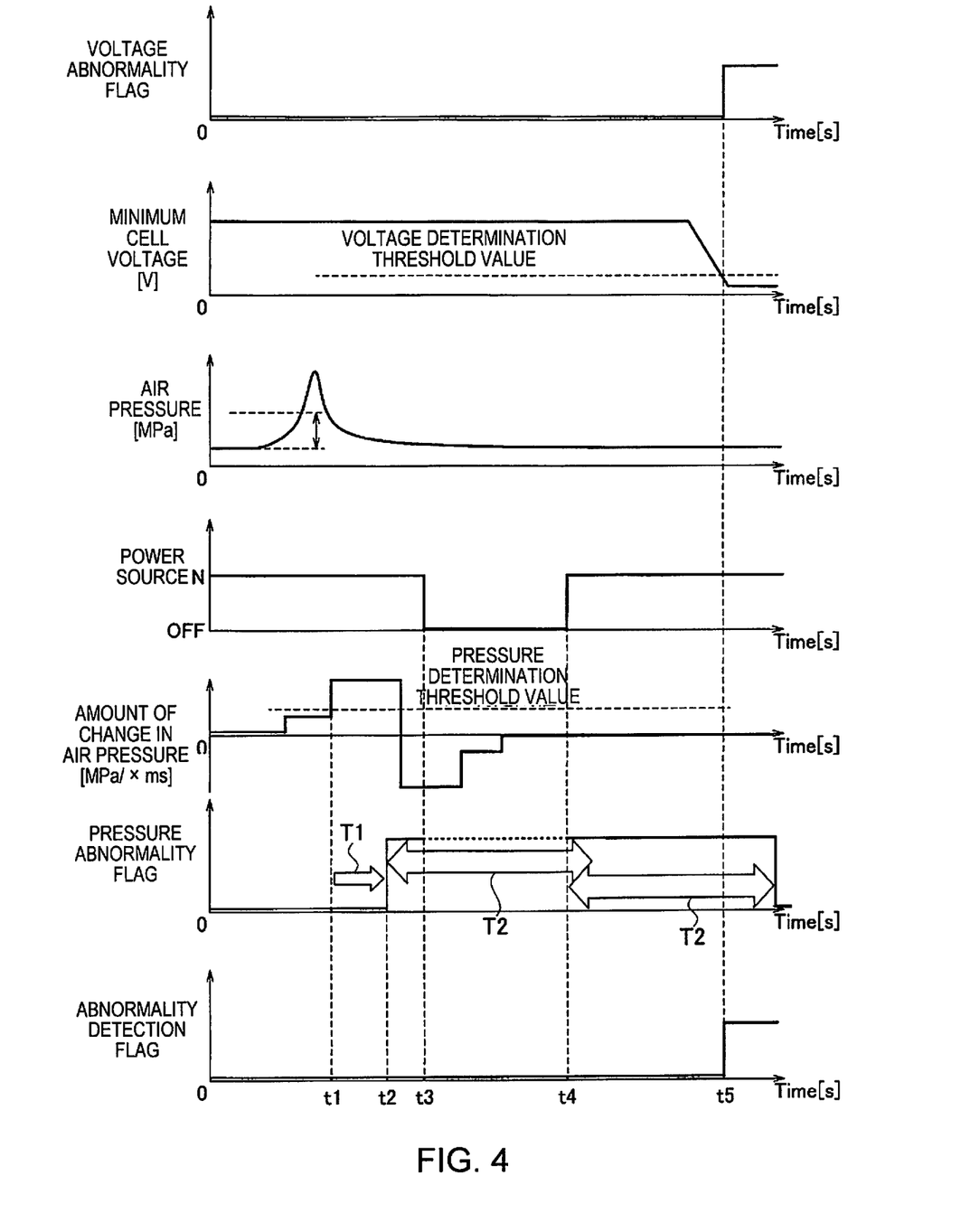
FIG. 4 is a timing chart for illustrating the battery abnormality warning method performed by the battery abnormality warning device according to the one embodiment of the present invention.

A battery abnormality warning method for a case in which a power source of the vehicle is turned off while a continuation time period has elapsed is described next on the basis of the timing chart in FIG. 4. Although a description is given here for a case in which the power source of the vehicle is turned off, the battery abnormality warning method can also be applied in a case in which a power source of the battery abnormality warning device 5 is turned off. As shown in FIG. 4, at time t1, the air pressure inside the battery pack 3 increases, and the amount of change in the air pressure reaches or exceeds the pressure determination threshold value. When the decision time period T1 elapses and time t2 is reached while the amount of change in the air pressure is equal to or greater than the pressure determination threshold value, the pressure abnormality determination unit 53 determines that a pressure abnormality has occurred in the battery pack 3 and sets the pressure abnormality flag.

At time t2, if the pressure abnormality flag is set, the pressure abnormality determination unit 53 starts a count of a continuation time period T2, and, during the continuation time period T2, continues the determination of a pressure abnormality even if the air pressure inside the battery pack 3 decreases.

When the power source of the vehicle is then turned off at time t3, the pressure abnormality determination unit 53 backs up the pressure abnormality flag in a memory. When the power source of the vehicle is turned on at time t4, the backed-up pressure abnormality flag is set again, a continuation time period T2 from the time t4 at which the power source of the vehicle was turned on is set again, and counting of the continuation time period T2 is started.

At time t5, the minimum cell voltage then reaches or falls below the voltage determination threshold value, and the voltage abnormality determination unit 51 determines that a voltage abnormality has occurred in the battery pack 3 and sets the voltage abnormality flag. At the same time, because both a pressure abnormality and a voltage abnormality are determined to have occurred within the continuation time period T2, the battery abnormality determination unit 55 determines that a thermal runaway abnormality has occurred in the battery pack 3 and sets an abnormality detection flag. The warning unit 59 then outputs a warning.

Thus, when the power source of the vehicle is turned off, the battery abnormality warning device 5 backs up the pressure abnormality flag, and again sets and starts the continuation time period T2 from a point when the power source of the vehicle is turned on. Because the pressure abnormality flag is not cleared even if the power source of the vehicle is turned off, this makes it possible to prevent interruption of the continuation time period T2 and to reliably detect an abnormality that has a high degree of importance. For example, because the continuation time period T2 that started at time t2 in FIG. 4 is already ended at the time t5 at which a voltage abnormality is determined, thermal runaway cannot be detected. However, because the battery abnormality warning device 5 again sets and starts the continuation time period T2 at the time t4 at which the power source of the vehicle is turned on, it is possible to detect an abnormality that has a high degree of importance, such as thermal runaway, due to the determination of a voltage abnormality at time t5.

Battery Abnormality Warning Process

Figure 5:
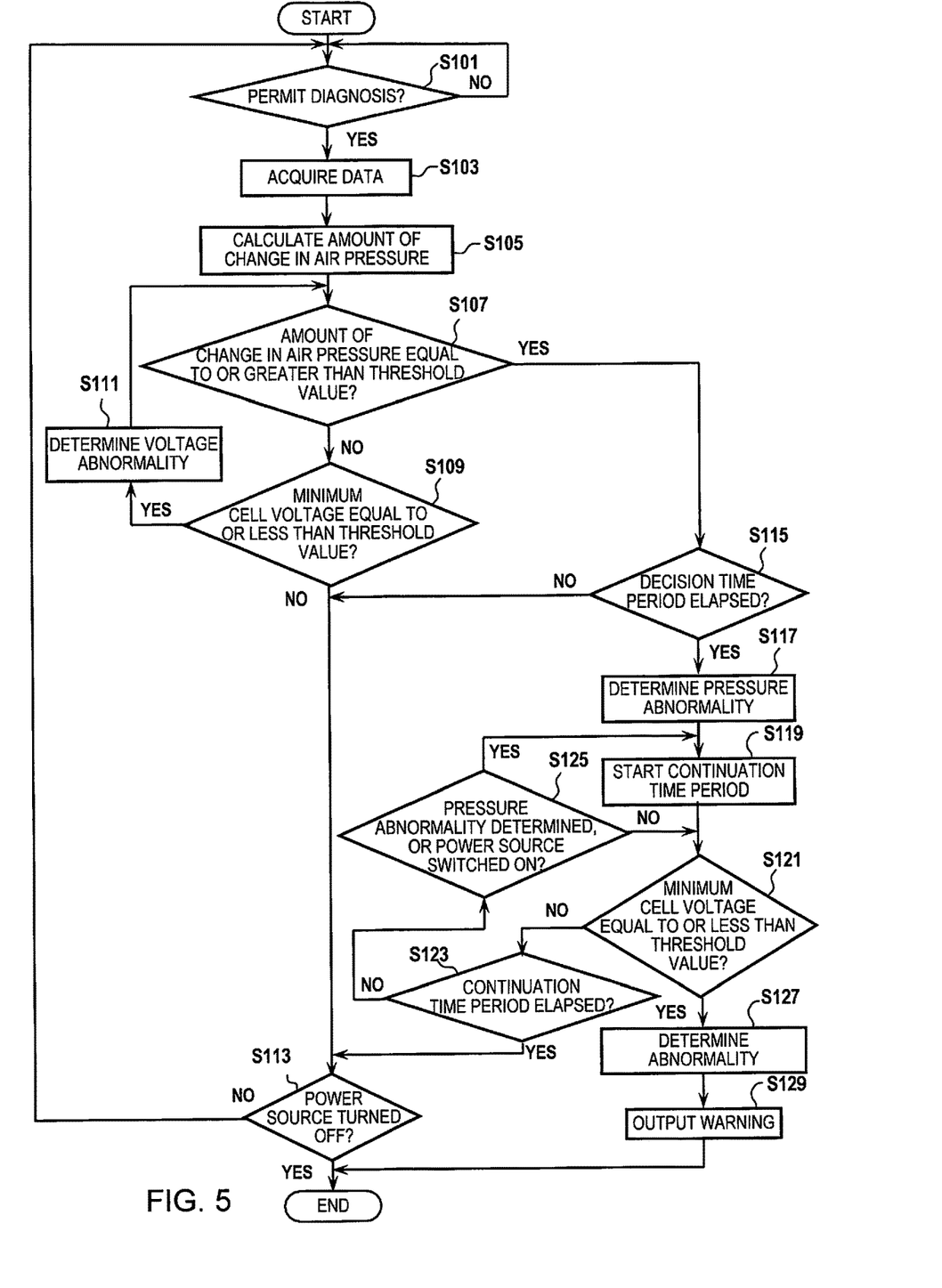
FIG. 5 is a flowchart showing a process sequence of a battery abnormality warning process performed by the battery abnormality warning device according to the one embodiment of the present invention.

A battery abnormality warning process performed by the battery abnormality warning device 5 according to the present embodiment is described next. FIG. 5 is a flowchart showing a process sequence of the battery abnormality warning process performed by the battery abnormality warning device 5 according to the present embodiment. The battery abnormality warning process is started when the power source of the vehicle is turned on.

As shown in FIG. 5, in step S101, the battery abnormality warning device 5 determines whether diagnosis permission conditions for diagnosis of an abnormality in the battery pack 3 are satisfied. When the diagnosis permission conditions are not satisfied, the battery abnormality warning process shown in FIG. 5 is not executed because no abnormality in the battery pack 3 can be diagnosed in a normal manner. The diagnosis permission conditions are that, inter alia, a power source voltage sufficient for the controller constituting the battery abnormality warning device 5 to operate is being supplied, the CPU constituting the battery abnormality warning device 5 is normal, no maintenance function is being used, and a starter switch of the vehicle is off. If these diagnosis conditions are satisfied, the process flow advances to step S103. However, if the diagnosis conditions are not satisfied, the determination as to whether the diagnosis conditions are satisfied continues to be made.

In step S103, the battery abnormality warning device 5 acquires data that is necessary in order to execute the battery abnormality warning process. For example, the voltage abnormality determination unit 51 acquires data pertaining to the minimum cell voltage from the battery controller 31, and the pressure abnormality determination unit 53 acquires data pertaining to the air pressure inside the battery pack 3 from the pressure sensors 33a, 33b.

In step S105, the pressure abnormality determination unit 53 calculates the amount of change from the value of the air pressure a given time period earlier as the amount of change in the air pressure inside the battery pack 3. The pressure abnormality determination unit 53 calculates the amount of change in the air pressure when conditions are satisfied such that, inter alia, the pressure sensors 33a, 33b have not failed, and the amount is not being calculated immediately after the vehicle control module starts up or recovers from failure.

In step S107, the pressure abnormality determination unit 53 determines whether or not the amount of change in air pressure detected in step S105 is equal to or greater than the pressure determination threshold value. If the amount of change in the air pressure is equal to or greater than the pressure determination threshold value, the process flow advances to step S115. However, if the amount of change in the air pressure is less than the pressure determination threshold value, the process flow advances to step S109.

In step S109, the voltage abnormality determination unit 51 determines whether or not the minimum cell voltage of the battery pack 3 is equal to or less than the voltage determination threshold value. If the minimum cell voltage is equal to or less than the voltage determination threshold value, the process flow advances to step S111. However, if the minimum cell voltage is greater than the voltage determination threshold value, the process flow advances to step S113.

In step S111, the voltage abnormality determination unit 51 determines that a voltage abnormality has occurred in the battery pack 3, and the process flow advances to step S107, and the determination as to whether a pressure abnormality has occurred in the battery pack 3 continues to be made.

In step S113, the battery abnormality warning device 5 determines whether the power source of the vehicle is turned off, and ends the battery abnormality warning process according to the present embodiment if the power source is turned off. However, if the power source is not turned off, the process flow returns to step S101, and the battery abnormality warning process continues to be executed.

If it is determined in step S107 that the amount of change in the air pressure is equal to or greater than the pressure determination threshold value, the process flow advances to step S115, and the pressure abnormality determination unit 53 determines whether the decision time period has elapsed while the amount of change in the air pressure is equal to or greater than the pressure determination threshold value. If the amount of change in the air pressure falls to less than the pressure determination threshold value before the decision time period elapses, the process flow advances to step S113. However, if the decision time period elapses while the amount of change in the air pressure is equal to or greater than the pressure determination threshold value, the process flow advances to step S117.

In step S117, the pressure abnormality determination unit 53 determines that a pressure abnormality has occurred in the battery pack 3. At the same time, in step S119, a count of the continuation time period is started.

In step S121, the voltage abnormality determination unit 51 determines whether or not the minimum cell voltage of the battery pack 3 is equal to or less than the voltage determination threshold value. If the minimum cell voltage is equal to or less than the voltage determination threshold value, the process flow advances to step S127. However, if the minimum cell voltage is greater than the voltage determination threshold value, the process flow advances to step S123.

In step S123, the pressure abnormality determination unit 53 determines whether the continuation time period has elapsed. If the continuation time period has elapsed, the determination of a pressure abnormality is cancelled and the process flow advances to step S113. However, if the continuation time period has not elapsed, the process flow advances to step S125.

In step S125, the pressure abnormality determination unit 53 determines whether a pressure abnormality is determined during the continuation time period, or whether the power source of the vehicle is switched on during the continuation time period after having been turned off. If a pressure abnormality is determined or the power source of the vehicle is switched on during the continuation time period, the process flow advances to step S119, and the continuation time period is again set and started. However, if no pressure abnormality is determined and the power source of the vehicle is not switched on during the continuation time period, the process flow returns to step S121, and the determination of a voltage abnormality is continued.

In step S121, if the minimum cell voltage is equal to or less than the voltage determination threshold value, the process flow advances to step S127. In step S127, the voltage abnormality determination unit 51 determines that a voltage abnormality has occurred in the battery pack 3, and the battery abnormality determination unit 55 determines that an abnormality that has a high degree of importance, such as thermal runaway, has occurred in the battery pack 3.

In step S129, the warning unit 59 outputs a warning to the display unit 7 or to the speaker, and the battery abnormality warning process according to the present embodiment is ended.

Using the battery abnormality warning device according to the present embodiment, as described in detail above, a determination as to whether a pressure abnormality has occurred in the battery is made on the basis of the air pressure inside the battery pack, and a determination as to whether a voltage abnormality has occurred in the battery is made on the basis of the cell voltage of the battery. When both a pressure abnormality in the battery and a voltage abnormality in the battery are determined to have occurred within a prescribed time period, it is determined that an abnormality has occurred in the battery, and a warning is outputted to the occupant in the vehicle. This makes it possible to distinguish between abnormalities that have a low degree of importance, or that arise from temporary factors, and abnormalities that have a high degree of importance, and to accurately detect abnormalities that have a high degree of importance, as well as to reliably warn the occupant in the vehicle about abnormalities in the battery.

Additionally, using the battery abnormality warning device 5 according to the present embodiment, it is determined that a pressure abnormality has occurred in the battery when a prescribed decision time period has elapsed while the amount of change in the air pressure inside the battery pack is equal to or greater than a prescribed threshold value. This makes it possible to accurately determine a pressure abnormality even if the air pressure inside the battery pack 3 changes due to a change in the altitude of the location being traveled by the vehicle in which the battery is mounted.

Furthermore, using the battery abnormality warning device 5 according to the present embodiment, the determination of a pressure abnormality is continued until a prescribed time period elapses from when a pressure abnormality is determined to have occurred in the battery, and the determination of a pressure abnormality is cancelled when the prescribed time period elapses. This makes it possible to accurately detect an abnormality in the battery even when the air pressure, upon having increased in a pressure abnormality, gently decreases due to the battery being provided with the breather.

Additionally, using the battery abnormality warning device 5 according to the present embodiment, when a pressure abnormality is again determined to have occurred while the prescribed time period has elapsed from when a pressure abnormality is determined to have occurred in the battery, the prescribed time period is again set and started from the point when a pressure abnormality in the battery is again determined. This makes it possible to reliably detect an abnormality that has a high degree of importance even when a plurality of pressure abnormalities have occurred at the same time.

Furthermore, using the battery abnormality warning device 5 according to the present embodiment, when the power source of the vehicle is turned off while the prescribed time period has elapsed from when a pressure abnormality is determined to have occurred in the battery, the prescribed time period is again set and started from the point when the power source of the vehicle is turned on. This makes is possible to reliably detect an abnormality that has a high degree of importance even when the power source of the vehicle is turned off while the prescribed time period has elapsed.

The embodiment described above is one example of the present invention. Therefore, as shall be apparent, the present invention is not limited to the embodiment described above; various modifications can be made in accordance with design, etc., provided that such modifications do not depart from the technical concept according to the present invention even in embodiments other than that described above.

The invention claimed is:

1. A battery abnormality warning method for detecting an abnormality in a battery mounted in a vehicle and warning an occupant of the vehicle, the battery abnormality warning method comprising:
   determining whether a pressure abnormality has occurred in the battery based on an air pressure inside a battery pack of the battery;
   determining whether a voltage abnormality has occurred in the battery based on a cell voltage of the battery;
   determining an abnormality has occurred in the battery when both the pressure abnormality in the battery and the voltage abnormality in the battery are determined to have occurred within a prescribed time period;
   resetting the prescribed time period to start from a point when a power source of the vehicle is turned on where the power source of the vehicle was turned off while the prescribed time period has elapsed after a determination that the pressure abnormality has occurred in the battery; and
   outputting a warning to the occupant in the vehicle upon determining that the abnormality has occurred in the battery.

2. The battery abnormality warning method according to claim 1, wherein
   the pressure abnormality is determined to have occurred in the battery when a prescribed decision time period has elapsed while an amount of change in the air pressure inside the battery pack is equal to or greater than a prescribed threshold value.

3. The battery abnormality warning method according to claim 2, wherein
   the determination of the pressure abnormality is continued until the prescribed time period elapses from after the determination of the pressure abnormality has occurred in the battery, and the determination of the pressure abnormality is cancelled when the prescribed time period elapses.

4. The battery abnormality warning method according to claim 1, wherein
   where a determination that the pressure abnormality has again occurred in the battery while the prescribed time period has elapsed after the pressure abnormality has occurred in the battery, the prescribed time period is reset to start from a point when a pressure abnormality in the battery is again determined.

5. A battery abnormality warning device comprising:
   a controller configured to detect an abnormality in a battery mounted to a vehicle and warn an occupant in the vehicle, the controller being configured to determine whether a pressure abnormality has occurred in the battery based on an air pressure inside a battery pack of the battery, determine whether a voltage abnormality has occurred in the battery based on a cell voltage of the battery;

determine that an abnormality has occurred in the battery when both the pressure abnormality in the battery and the voltage abnormality in the battery are determined to have occurred within a prescribed time period;

reset the prescribed time period to start from a point when a power source of the vehicle is turned on where the power source of the vehicle was turned off while the prescribed time period has elapsed after a determination that the pressure abnormality has occurred in the battery; and output a warning to the occupant in the vehicle upon determining that the abnormality has occurred in the battery.

\* \* \* \* \*